(12) United States Patent
Endoh

(10) Patent No.: US 7,271,599 B2
(45) Date of Patent: Sep. 18, 2007

(54) SEMICONDUCTOR DEVICE

(75) Inventor: Tsutomu Endoh, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/485,436

(22) Filed: Jul. 13, 2006

(65) Prior Publication Data
US 2007/0024290 A1 Feb. 1, 2007

(30) Foreign Application Priority Data
Jul. 26, 2005 (JP) .............................. 2005-215608

(51) Int. Cl.
G01R 27/08 (2006.01)
(52) U.S. Cl. ................... 324/705; 324/76.11
(58) Field of Classification Search ................. 324/705
See application file for complete search history.

(56) References Cited

U.S. PATENT DOCUMENTS 6,359,460 B1 * 3/2002 Tanaka ........................ 324/765
2003/0230733 A1 * 12/2003 Tanaka ........................ 250/553

FOREIGN PATENT DOCUMENTS

| JP | 9-284652 | 10/1997 |
| JP | 2003-318712 | 11/2003 |
| JP | 2004-20325 | 1/2004 |

* cited by examiner

Primary Examiner—Vincent Q. Nguyen
(74) Attorney, Agent, or Firm—Young & Thompson

(57) ABSTRACT

An infrared radiation image pickup apparatus, the image pickup elements of which are each formed by a bolometer, is disclosed. The resistance value of the bolometer outside a preset range in a given readout circuit associated with a given image pickup element does not affect other readout circuits performing parallel operations with the readout circuit. The readout circuit includes an OP amplifier 5, a non-inverting input terminal of which is connected to an output of a D/A converter 7, a MOS transistor 4, and a switch 6. The MOS transistor 4 has a gate connected to an output terminal of the OP amplifier 5 and has a source connected to an inverting input terminal of the OP amplifier 5 and connected via a horizontal switch 3 to a bolometer 1. The switch 6 is connected between the gate and the source of the MOS transistor 4. The D/A converter 7 receives data for applying a bias voltage to the bolometer 1, and outputs the bias voltage. In case at least the output voltage of the D/A converter 7 is outside a preset range, that is, in case input data to the D/A converter 7 is preset data, the input data is decoded by a decoder 8, and the horizontal switch 3 is opened by an output of a NOR circuit 9a, while the switch 6 is short-circuited.

17 Claims, 10 Drawing Sheets

DISTRIBUTION OF RESISTANCE VALUES
IN A DISPLAY PANEL OF RESISTANCE ARRAY

| D/A STAGES | DIGITAL DATA | RANGE OF RESISTANCE CORRECTION | |
|---|---|---|---|
| 15 | 1111 | 12.5% | ← HIGH RESISTANCE DEFECT |
| 14 | 1110 | 10.8% | |
| 13 | 1101 | 9.2% | |
| 12 | 1100 | 7.5% | |
| 11 | 1011 | 5.8% | |
| 10 | 1010 | 4.2% | |
| 9 | 1001 | 2.5% | |
| 8 | 1000 | 0.8% | |
| 7 | 0111 | −0.8% | |
| 6 | 0110 | −2.5% | |
| 5 | 0101 | −4.2% | |
| 4 | 0100 | −5.8% | |
| 3 | 0011 | −7.5% | |
| 2 | 0010 | −9.2% | |
| 1 | 0001 | −10.8% | |
| 0 | 0000 | −12.5% | ← LOW RESISTANCE DEFECT | ns
SEMICONDUCTOR DEVICE

FIELD OF THE INVENTION

This invention relates to a semiconductor apparatus. More particularly, the present invention relates to a semiconductor apparatus including an array of resistors, such as infrared radiation image pickup (sensing) elements, in which the apparatus operates in a stabile state even when the resistance values of the array of resistors are subjected to variations.

BACKGROUND OF THE INVENTION

In infrared radiation image pickup elements, the pixels undergo variations in characteristics. There are two types of the variations, that is, bias level variations, found on the element-to-element basis, and variations in device sensitivity. An infrared radiation image pickup apparatus for correcting these variations has been disclosed in Patent Document 1, filed in the name of the present Assignee. A semiconductor apparatus for implementing the function of correcting the variations has also been disclosed in Patent Document 2.

In a bolometer infrared radiation sensor, as one of the thermal infrared radiation sensor, changes in the bolometer resistance are becoming delicate due to miniaturization of the sensor size. The integration and sample hold with low noise need to be implemented for detecting such minor changes in resistance. The circuit designed for this purpose is disclosed in Patent Document 3, filed in the name of the present Assignee.

FIG. 8 depicts a circuit diagram showing a readout circuit part of the image pickup apparatus disclosed in the Patent Document 3. In this image pickup apparatus, a large number of thermo-electric transducing elements 102 are formed on a semiconductor substrate. The thermo-electric transducing elements 102, used in the present image pickup apparatus, are each formed by a bolometer formed on a diaphragm, and are sensitive to incident infrared radiations. These thermo-electric transducing elements are formed one-dimensionally or two-dimensionally on the substrate, and are switched over by a large number of pixel switches 101 and a large number of horizontal switches 103, as later explained, so that the transducing elements are selected sequentially. A bias voltage 108 is applied to the thermo-electric transducing element 102 through a bias circuit 141 made up by an Nch MOS transistor 104, an operational amplifier (OP amplifier) 105, a switch 106 and a capacitor 107. Specifically, the bias circuit 141 includes the Nch MOSFET 104, having a gate connected to an output terminal of the OP amplifier 105, while also including the switch 106 and the capacitor 107, connected in parallel with each other between the source and the gate of the Nch MOS FET 104. The source of the Nch MOSFET 104 is connected to an inverting input terminal (−) of the OP amplifier 105, while the bias voltage terminal 108 is connected to the non-inverting input terminal (+) of the OP amplifier 105. The source of the Nch MOSFET 104 is connected to one end of the switch 103, also termed the horizontal switch, the other end of which is connected to the thermo-electric transducing element 102. The OP amplifier 105 is provided for compensating for voltage drop of the gate-to-source voltage Vgs of the Nch MOS FET 104.

There is also provided a bias cancellation circuit 142, made up by a bias cancellation resistor 109, a switch 110, a Pch MOSFET 111, an OP amplifier 112 and a switch 113. An offset component in the drain current of the Nch MOSFET 104, that is, the current flowing through the thermo-electric transducing element 102, is eliminated by a bias cancellation voltage 114. More specifically, the bias cancellation circuit 142 includes a bias cancellation resistor 109 and a Pch MOSFET 111. The bias cancellation resistor 109 is connected between the power supply VCC and one end of the switch 110, and the Pch MOSFET 111 has a source connected to the other end of the switch 110, while having a gate connected to the output terminal of the OP amplifier 112. The OP amplifier 112 has an inverting input terminal (−) connected to the source of the Pch MOSFET 111, while having a non-inverting terminal (+) connected to the bias cancellation voltage terminal 114. The switch 113 is connected between the source and the gate of the Pch MOSFET 111, while the drain of the Pch MOSFET 111 is connected to the drain of the Nch MOSFET 104. Similarly to the OP amplifier 105, the OP amplifier 112 is provided for compensating for voltage drop of the gate-to-source voltage Vgs of the Pch MOS FET 111.

During the off-period of the horizontal switch 103, such as during the switching of the sequential scanning, or during the off-period of the pixel switch 101, such as during switching of the vertical lines, that is, during the period of non-selection of the thermo-electric transducing element 102, no current flows through the bias circuit 141. Consequently, the mutual conductance gm of the Nch MOSFET 104 is lowered, so that the resistance component of the feedback loop of the OP amplifier 105 is increased, and hence the phase delay is increased. Thus, it is not possible to provide for phase allowance of the OP amplifier 105.

For this reason, the switch 106 is provided between the gate and the source of the Nch MOSFET 104, in order to exercise control in such a manner that, during the period of non-selection of the thermo-electric transducing element 102, the connection of the OP amplifier 105 will be in a voltage-follower configuration. When the switch 106 is turned on, the output terminal of the OP amplifier 105 is connected to the inverting terminal (−), that is, connected in a voltage-follower configuration.

The above is similarly the case with the bias cancellation circuit 142. That is, the switch 113 is provided between the gate and the source of the Pch MOSFET 111, in order to exercise control in such a manner that, during the period of non-selection of the thermo-electric transducing element 102, the connection of the OP amplifier 112 will be in a voltage-follower configuration. The reason is that, if the bias circuit 141 performs the above control, the current in the bias cancellation circuit 142 is redundant, so that it is necessary to perform control to turn off the switch 110 in synchronization with the turning off of the horizontal switch 103.

There is also performed a resetting operation of the integrating sample hold circuit 131. It is noted that, during the period of non-selection, the bias circuit 141 and the bias cancellation circuit 142 are in invalidated states. Hence, there is provided a switch 115 for isolating the integrating sample hold circuit 131 from the bias circuit 141 and the bias cancellation circuit 142, by way of performing switching control, in such a manner that the resetting operation will be carried out reliably. The switch 115 is in an off-state during the resetting period of the integrating sample hold circuit 131.

Also, there flows no bias current in case any one of the thermo-electric transducing elements 102 undergoes pixel failure such as opening caused by process defects. Thus, the mutual conductance gm of the Nch MOSFET 104 is lowered to increase the resistance component of the feedback loop of the OP amplifier 105, so that the phase delay is increased such that no phase allowance can be maintained. Hence, the bypass capacitor 107 is provided between the gate and the source of the Nch MOSFET 104 to maintain the phase allowance.

When one circuit is subjected to oscillation, the effect of parallel integration on the other circuitry may appear through, e.g., a power supply line. Thus, the configuration of the bias circuit 141 helps assure the stabilized operation.

FIG. 9 depicts a circuit diagram showing the image pickup apparatus in its entirety, inclusive of the configuration of the readout circuit of FIG. 8 and the peripheral part. In the present configuration, a large number of thermoelectric transducing elements 202 are two-dimensionally arranged in a matrix pattern on a substrate and sequentially selected as the thermo-electric transducing elements 202 are changed over by pixel switches 201 and horizontal switches 204. There are provided two types of switches, namely switches HA and HB, as horizontal switches 204. These switches HA and HB come into play by Φ HA and Φ HB signals, which are activated in two phases A and B, respectively, during each horizontal period. There are provided pixel switches 201 at the points of intersection of signal lines 203 and scanning lines 211. The pixel switches 201 are each formed by an Nch MOSFET having a source grounded, having a drain connected via thermo-electric transducing element 202 to the signal line 203 and having a gate connected to the scanning line. The signal lines 203 are each connected via horizontal switch 204 to a readout circuit 206. The readout circuit 206 has an output connected via a multiplexer switch 207 to an output buffer 209. The multiplexer switch 207 is turned on or off by a horizontal shift register 208.

The readout circuit 206 is provided every two columns of the matrix, associated with the switches HA and HB, in order to read out a signal of each thermo-electric transducing element 202. A vertical shift register 205 sequentially selects the rows of the matrix. The horizontal shift register 208 sequentially selects the multiplexer switches 207 to transmit the output of each readout circuit 206 to the output buffer 209.

FIG. 10 depicts a timing chart showing the operation of the entire image pickup elements. Referring to FIG. 10, there are the phases A and B during one horizontal cycle period. The Φ HA and Φ HB signals are ON in the integrating mode of the respective phases. During the integrating mode period, the sample hold circuit enters into a sample mode, when the S/H (sample hold) pulse is HIGH, to sample an output of the integrating circuit. When the S/H pulse is LOW, the sample hold circuit enters into a hold mode. After resetting, the integrating operation enters into an integrating mode. In FIG. 10, the sample hold circuit enters into a sample mode, at a timing close to the end of the integrating mode, to sample an output of the integrating circuit. An output of the sample hold circuit for n channels is time-divisionally output via multiplexer.

[Patent Document 1]
    Japanese Patent Kokai Publication No. JP-A-9-284652

[Patent Document 2]
    Japanese Patent Kokai Publication No. JP-P2004-20325A

[Patent Document 3]
    Japanese Patent Kokai Publication No. JP-P2003-318712A

SUMMARY OF THE DISCLOSURE

An image sensor, such as a bolometer infrared radiation sensor, suffers from considerable variations in resistance values. These variations are compensated for by a method such as one shown in Patent Document 1. However, in the image sensor, there are failed pixels subjected to extreme variations in the resistance values, such as open-circuited pixels, caused by process defects. That is, there are pixels the resistance values of which become higher or lower than prescribed values. In case where any one of pixels, the resistance value of which becomes higher than the prescribed value, has been selected by sequential scanning, the mutual conductance gm of the NMOS transistor 104 in the feedback loop of the OP amplifier 105, forming the bias circuit 141, applying the bias voltage to the bolometer, is lowered, and hence the impedance of the feedback loop is increased. In such case, the phase allowance of the OP amplifier 105 may be aggravated, so that oscillations tend to be produced. If the OP amplifier is subjected to oscillations, other readout circuits, carrying out parallel processing, tend to be affected through, e.g., a power supply line. In Patent Document 3, the bypass capacitor 107 is provided between the gate and the source of the NMOS transistor 104 to provide for the phase margin. However, in this case, the chip may be increased in area by providing the bypass capacitor 107.

If conversely a pixel having a resistance value lower than a prescribed value is selected by sequential scanning, there flows an excess bolometer current, thus possibly causing saturation of the integrating OP amplifier in the integrating sample hold circuit 131. In this case, an IR drop of a value more than may be presumed tends to be caused in the power supply line, thus possibly affecting other readout circuits carrying out parallel processing.

In one aspect, the present invention provides a semiconductor apparatus including a plurality of resistance measurement elements, each converting a physical quantity into a resistance value, and a first switch device connected to one of the resistance measurement elements to permit the electrical current to pass through the resistance measurement element. The semiconductor apparatus also includes a bias circuit that applies a bias voltage to one of the resistance measurement elements, and an integrating circuit that integrates a current flowing through one of the resistance measurement elements to store the integrated current. The semiconductor apparatus detects changes in a resistance value of one of the resistance measurement elements, based on the current stored in the integrating circuit, thereby indirectly measuring the physical quantity. The bias circuit includes: an OP amplifier, having a non-inverting input terminal connected to a bias voltage supplying terminal, and a MOS transistor. The MOS transistor has a gate connected to an output terminal of the OP amplifier, while having a source connected to an inverting input terminal of the OP amplifier and connected via the first switch device to one of the resistance measurement elements. The bias circuit also includes a second switch device connected between the gate and the source of the MOS transistor. There is also provided a switch control circuit which performs control so that, when the resistance measurement element, the resistance value of which is outside a preset range, is selected, the first switch device is opened and the second switch device is short-circuited.

In another aspect, the present invention provides a measurement apparatus including a plurality of objects to be biased, each converting a physical quantity into a resistance value, and a first switch device connected to one of the objects to be biased to permit electrical current to pass through the object to be biased. The measurement apparatus also includes a bias circuit that applies a bias voltage to one of the objects to be biased, and an integrating circuit that integrates a current flowing through one of the objects to be biased to store the integrated current. The measurement apparatus detects changes in a resistance value of one of the objects to be biased, based on the current stored in the integrating circuit, to indirectly measure the physical quantity. The bias circuit includes an OP amplifier, having a non-inverting input terminal connected to a bias voltage supplying terminal, and a MOS transistor. The MOS transistor has a gate connected to an output terminal of the OP amplifier, while having a source connected to an inverting input terminal of the OP amplifier and connected via the first switch device to one of the objects to be biased. The bias circuit also includes a second switch device connected between the gate and the source of the MOS transistor. There is provided a switch control circuit which performs control so that, when the object to be biased, the resistance value of which is outside a preset range, is selected, the first switch device is opened and the second switch device is short-circuited.

The meritorious effects of the present invention are summarized as follows.

According to the present invention, such an operation of the semiconductor apparatus or a measurement apparatus may be enabled in which, even in case a resistor element, such as thermo-electric transducing element, has a resistance which is outside of a preset range, it is possible, without increase in the chip area, to prevent the effect of the resistor element with the resistance outside the preset range from being exerted on any readout circuit or circuits other than the readout circuit associated with the resistor element and which is/are performing parallel operation with this readout circuit.

PREFERRED EMBODIMENTS OF THE INVENTION

Figure 1:
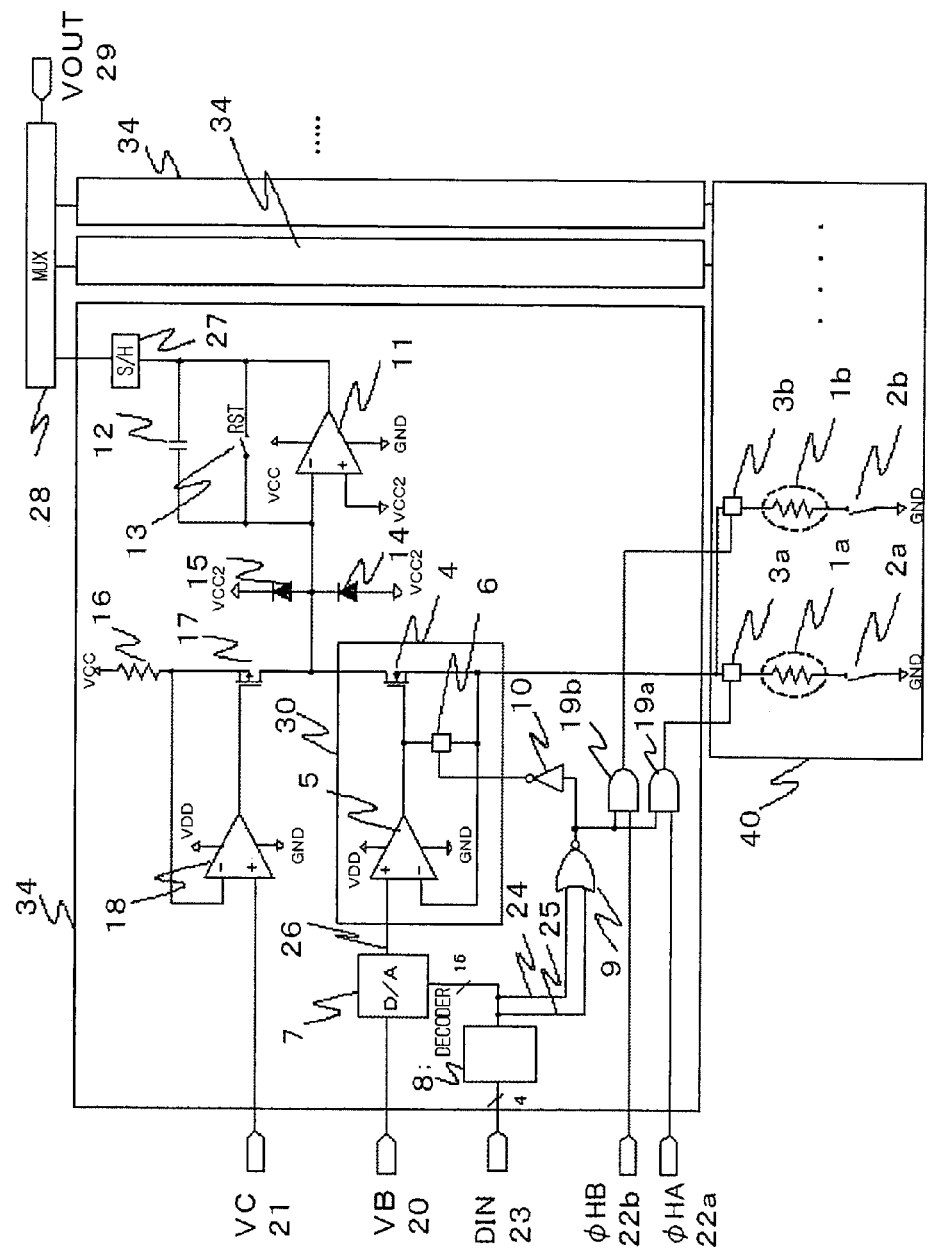
FIG. 1 is a circuit diagram showing the configuration of a semiconductor apparatus according to a first embodiment of the present invention.

A semiconductor apparatus, embodying the present invention, includes a resistor array (40 of FIG. 5), made up by at least one bolometer (1 of FIG. 5) for transducing a physical quantity, specifically, the intensity of infrared radiations, into a resistance value, and a first switch device (3 of FIG. 5), connected to each bolometer to permit electrical current to pass through the bolometer. The semiconductor apparatus also includes a bias circuit (30 of FIG. 5) for applying a bias voltage to one of the bolometers, and an integrating circuit for integrating the current flowing through the bolometer for storing the integrated current. The semiconductor apparatus detects changes in a resistance value of the bolometer, based on the current stored in the integrating circuit, for indirectly measuring the physical quantity. The bias circuit includes an OP amplifier (5 of FIG. 5), having a non-inverting input terminal connected to a bias voltage supplying terminal, and a MOS transistor (4 of FIG. 5), having a gate connected to an output terminal of the OP amplifier and having a source connected to an inverting input terminal of the OP amplifier and also connected via the first switch device to one of the bolometers. The bias circuit also includes a second switch device (6 of FIG. 5) connected between the gate and the source of the MOS transistor. There is provided a switch control circuit for performing control so that, when the bolometer, the resistance value of which is outside a preset range, is selected, the first switch device is opened and the second switch device is short-circuited. There is also provided a D/A converter (7 of FIG. 5) for outputting a voltage supplied to the bias voltage supply terminal, based on data of resistance values of each bolometer measured in advance and saved. The switch control circuit performs control so that, when the data is preset data, the first switch device is opened and the second switch device is short-circuited.

The semiconductor apparatus, described above, may verify a given pixel to be a failed pixel, from input data of the D/A converter, and short-circuits a feedback loop of the OP amplifier by the second switch device to provide for a voltage follower configuration of the OP amplifier. Since this increases circuit stability of the OP amplifier (phase margin), there is no risk of oscillations. Hence, a bypass capacitor, used in a conventional semiconductor apparatus for assuring the phase margin in case of selection of a high resistance pixel, may be dispensed with. Moreover, in case of low resistance failure of a pixel, it is possible to inhibit the excess bolometer current, by opening the first switch device, to prevent the adverse effect of the IR drop otherwise caused by the excess current. In this manner, the adverse effect on other readout circuits, performing parallel operation, may be removed. Certain preferred embodiments of the present invention will now be described with reference to the drawings.

First Embodiment

FIG. 1 depicts a circuit diagram showing the configuration of a semiconductor device according to a first embodiment of the present invention. In FIG. 1, a resistor array 40 shows a resistor array part 221 in a resistor array 220 shown in FIG. 9. A large numbers of bolometers 1a, 1b . . . are arrayed one-dimensionally or two-dimensionally on a substrate and are sequentially selected by being switched over by pixel switches 2a, 2b and horizontal switches 3a, 3b. A bias circuit 30, as a circuit for transducing changes in the resistance of the bolometers 1a, 1b into changes in the current, made up by an N channel MOS transistor (NMOS transistor) 4, an OP amplifier 5 and a switch 6, applies an output voltage 26 of a D/A converter 7 to the bolometer 1a or 1b. More specifically, the bias circuit 30 includes an NMOS transistor 4, the gate of which is connected to an output terminal of an OP amplifier 5, and a switch 6, connected between the source and the gate of the NMOS transistor 4. The source of the NMOS transistor 4 is connected to an inverting input terminal (−) of the OP amplifier 5. An output voltage 26 of the D/A converter 7 is applied a non-inverting input terminal (+) of the OP amplifier 5. The source of the NMOS transistor 4 is connected to one ends of horizontal switches 3a, 3b. The opposite end of the horizontal switch 3a is connected to the bolometer 1a, while the opposite end of the horizontal switch 3 is connected to the bolometer 1b. The horizontal switches 3a, 3b and the switch 6 are each formed by a transfer gate.

Figure 10:
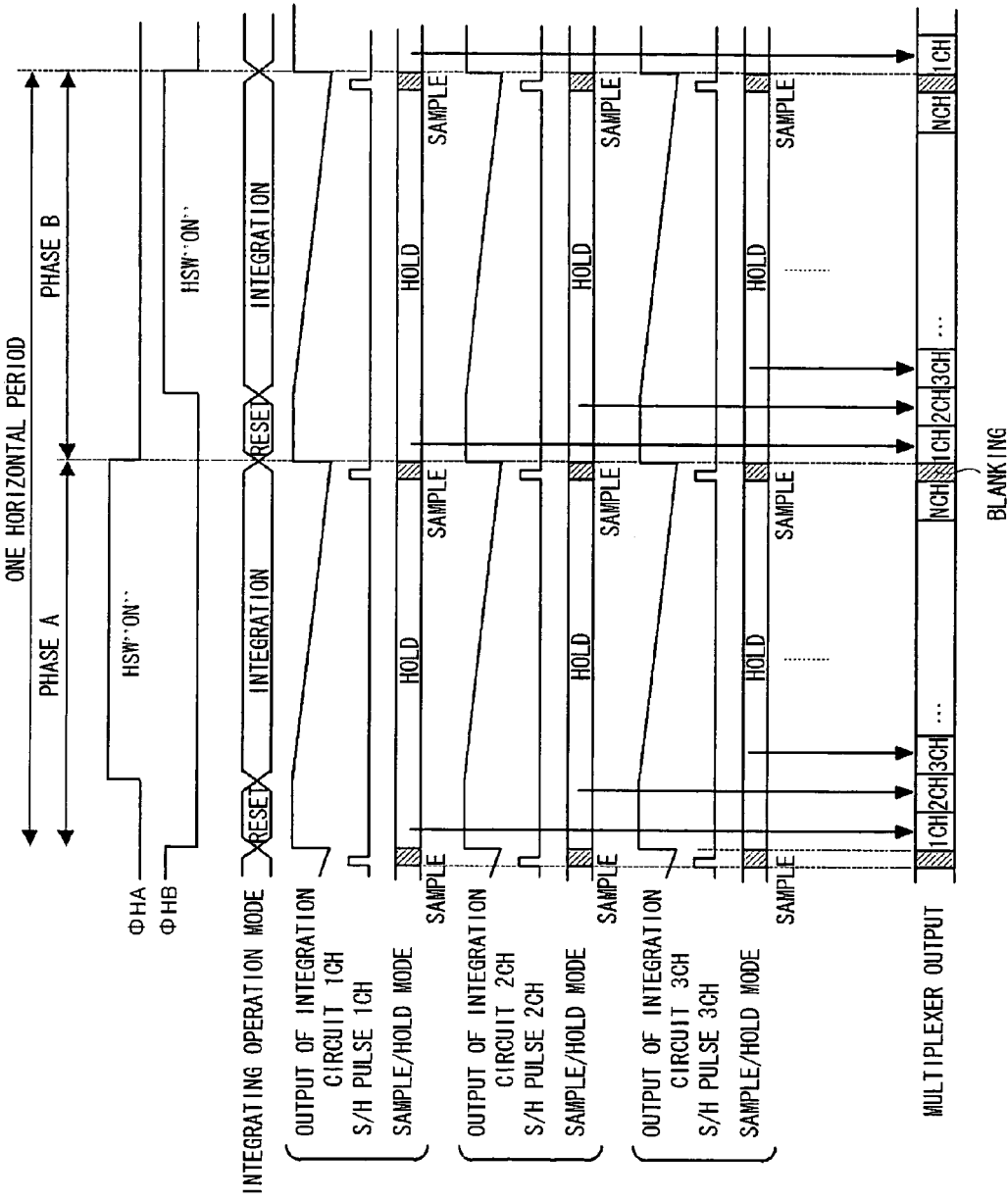
FIG. 10 is a timing chart for illustrating the operation of the image pickup element in its entirety.

There are also provided a decoder 8, receiving 4-bit data (DIN) 23, as later explained, and decoding the so received data to output decoded data to the D/A converter 7, and a NOR circuit 9 for taking a logical sum of the most significant data 24 and the least significant data 25 of the output of the decoder 8. There is also provided an inverter circuit 10 for inverting the output of the NOR circuit 9 to transmit the inverted output to a control end of the switch 6. Furthermore, there are provided AND circuits 19a, 19b, one input ends of which are supplied with a Φ HA signal 22a and a Φ HB signal 22b, synchronized with a horizontal synchronizing signal, and the other input ends of which are supplied with an output of the NOR circuit 9. It is noted that the Φ HA signal 22a and the Φ HB signal 22b are ON (become HIGH) during the periods of the phases A and B of FIG. 10, respectively. Outputs of the AND circuits 19a, 19b are transmitted to the control ends of the horizontal switches 3a, 3b, respectively.

In the above-described configuration, the voltage applied to one ends of the horizontal switches 3a, 3b becomes the voltage of the non-inverting input terminal (+) of the OP amplifier 5, that is, the output voltage 26 of the D/A converter 7. Hence, the voltage applied to the horizontal switches 3a, 3b can be controlled highly accurately. The on-resistances of the horizontal switches 3a, 3b are normally designed to be sufficiently small as compared to the resistance values of the bolometers 1a, 1b, in order to prevent the temperature coefficient of the bolometers 1a, 1b from being lowered apparently. Hence, the voltage applied to the horizontal switches 3a, 3b is approximately equal to the voltage applied to one ends of the bolometers 1a, 1b.

In FIG. 1, the NMOS transistor 4 and the OP amplifier 5 represent a circuit for applying the voltage to the bolometer 1a or 1b and for allowing the bolometer current to flow through the drain of the transistor. Hence, in this circuit, the effect of Vgs (gate-to-source voltage) of the NMOS transistor does not appear in the drain current. The gate-to-source voltage Vgs usually has a high temperature coefficient due to temperature dependency of the threshold value Vt of the transistor. Since the circuit of FIG. 1 is configured for not allowing the effect of the gate-to-source voltage Vgs to be presented in the drain current, by way of compensating for voltage drop, the effect of the temperature coefficient of the gate-to-source voltage Vgs (temperature drift) may be eliminated.

During the off-period of the horizontal switches 3a, 3b, such as at the time of switching of the sequential scanning, or during the off-period of the pixel switches 2a, 2b, such as at the time of switching of the vertical lines, that is, during the periods of non-selection of the bolometers 1a and 1b, no bias current flows through the bias current 30. Consequently, the mutual conductance gm of the Nch MOSFET 4 is lowered, so that resistance component of the feedback loop of the OP amplifier 5 is increased, and hence the phase delay is increased. Thus, it is not possible to provide for phase margin (or allowance) of the OP amplifier 5. For this reason, the switch 6 is provided between the gate and the source of the NMOS transistor 4, in order to exercise control so that, during the period of non-selection of the bolometers 1a, 1b, the connection of the OP amplifier 5 itself will be in a voltage-follower configuration. When the switch 6 is turned on, the output terminal of the OP amplifier 5 is connected to the inverting input terminal (−), that is, connected in a voltage-follower configuration. In this case, the gain is equal to unity to assure the phase margin.

Figure 8:
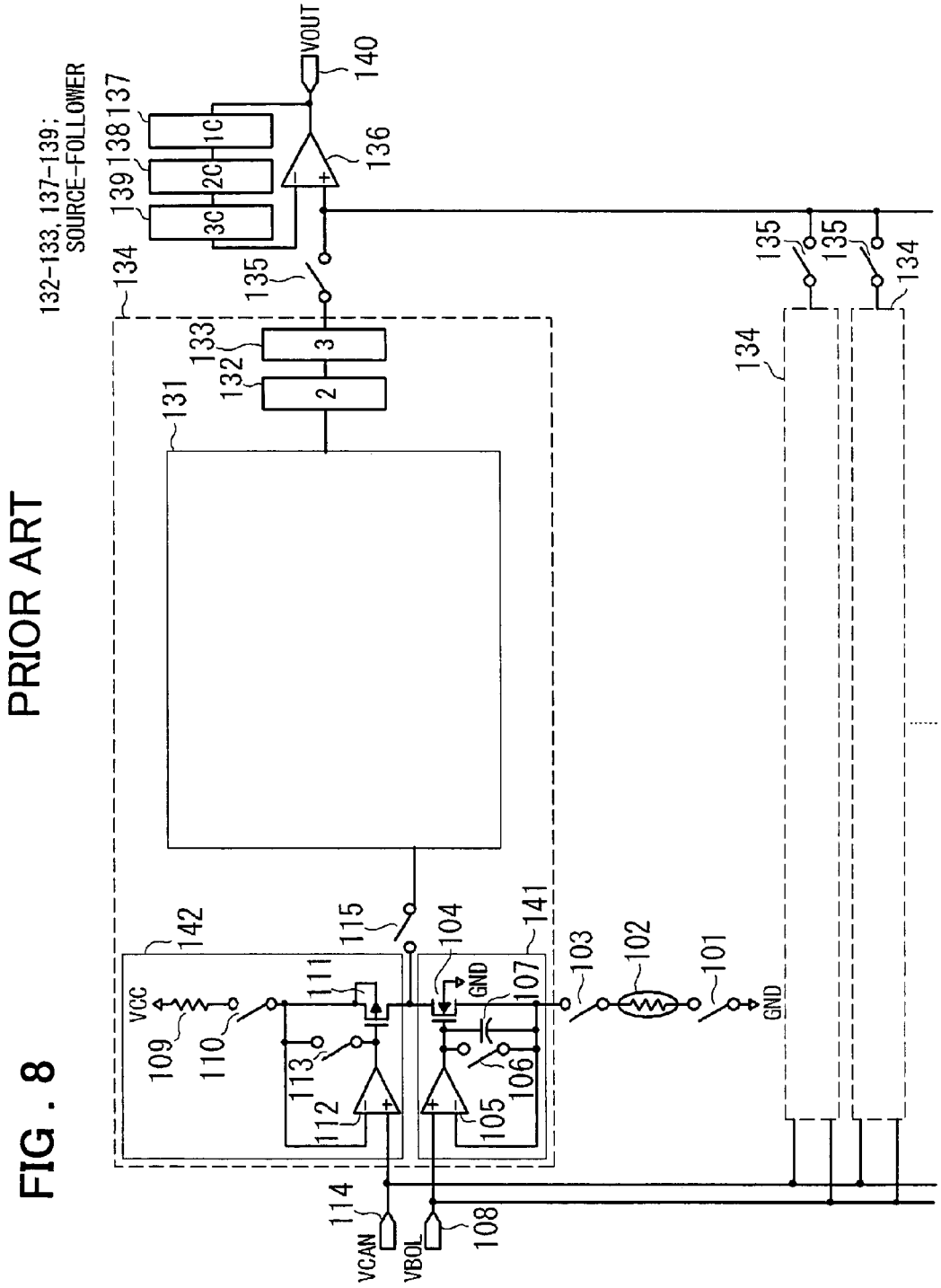
FIG. 8 is a circuit diagram showing a readout circuit part of a conventional image pickup apparatus.

The circuit made up by a resistor 16, a P-channel MOS transistor (PMOS transistor) 17 and an OP amplifier 18 is equivalent to the 'bias cancellation circuit' as explained in connection with the related art. A bias cancellation voltage VC21 is applied to the non-inverting terminal of the OP amplifier 18, the inverting terminal of which is connected to one end of the resistor 16 and to the source of the PMOS transistor 17 and the output terminal of which is connected to the gate of the PMOS transistor 17. The drain of the PMOS transistor 17 and that of the NMOS transistor 4 are connected common to equate approximately the current flowing to the bolometers 1a, 1b (Ibol) to the current flowing to the bias cancellation circuit side (Ican). By so doing, the DC current (direct current) flowing into the integrating capacitor 12 may be decreased to the smallest value possible. If the DC current flows into the integrating capacitor 12, the dynamic range of the circuit is taken up mainly by the DC current, rather than by a signal intrinsically desired to be amplified, with the result that the integration gain cannot be increased. The bias cancellation circuit is aimed to solve this problem. The OP amplifier 18 is similarly aimed to compensate for the Vgs voltage drop of the PMOS transistor 17 and for the temperature coefficient. Meanwhile, the bias cancellation circuit may be configured similarly to the bias cancellation circuit 142 described with reference to FIG. 8.

The drain of the NMOS transistor 4 and that of the PMOS transistor 17 are connected to one end of the integrating capacitor 12 and to the inverting input terminal of an integrating OP amplifier 11. The opposite end of the integrating capacitor 12 is connected to the output terminal of the integrating OP amplifier 11. The non-inverting input terminal (+) of the integrating OP amplifier 11 is connected to a power supply VCC2. A reset switch 13 is connected in parallel between the terminals of the integrating capacitor 12. After signal integration and readout, the reset switch 13 is turned on to reset the integrating capacitor 12.

A pair of clipping diodes 14, 15, connected to the inverting input terminal (−) of the integrating OP amplifier 11, operates for eking out excess current in case the bolometer current or the current for bias cancellation becomes excessive such that the output of the integrating OP amplifier 11 has become saturated.

The signal integrated by the integrating capacitor 12 is taken out from the output terminal of the integrating OP amplifier 11 and transmitted to a sample hold circuit 27. A multiplexer 28 selects one of output signals of the sample hold circuits 27 of the plural readout circuits 34 to output the so selected signal to an output terminal (VOUT) 29.

The D/A converter 7 selects the voltage (bias voltage) supplied to the bolometers 1a, 1b, responsive to variations in the resistance values of the multiplicity of the bolometers 1a, 1b, provided in the resistor array 40, so that variations in the current values of the currents Ibol flowing in the bolometers 1a, 1b will be diminished. With the resistance value Rbol of the bolometer 1a, the voltage value Vbol applied to the bolometer 1a and with the current value Ibol flowing in the bolometer 1a, for example, Ibol=Vbol/Rbol. The variations in Ibol may be reduced to a small value, by suitably selecting Vbol, by the D/A converter 7, responsive to variations in Rbol, even though Rbol is varied significantly. By so doing, the currents flowing through the multiplicity of the one-dimensionally or two-dimensionally arranged bolometers 1a, 1b can be set to reciprocally approximately equal current values, so that the dynamic range of the circuit may be set to a larger value. In addition, the sensitivity to incident infrared radiations may be made constant.

Figures 2A, 2B:
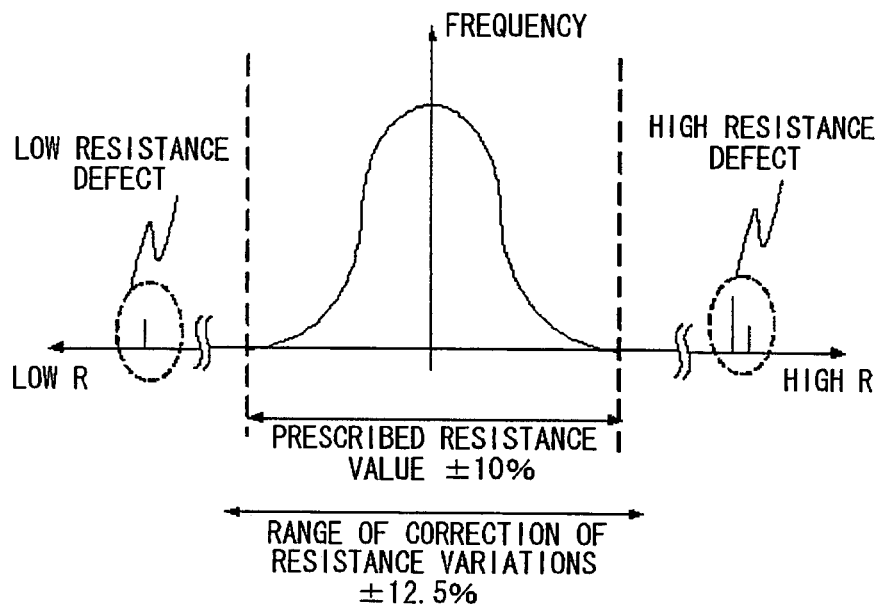
FIGS. 2A and 2B are graphs showing the distribution of variations in the resistance value of a bolometer and data for correction of the resistance value.

The method for setting the bias voltage, supplied to the bolometers 1a, 1b, will now be described. FIG. 2A schematically shows the frequency distribution of resistance values of the bolometers 1a, 1b in a display panel. It is here assumed that a prescribed value of variations (allowed range of variations) with respect to a median value of the frequency distribution is equal to the median value ±10%. It is also assumed that a voltage range necessary for the D/A converter 7 is ±10% of the resistance variations plus a certain allowance, specifically, ±12.5%. For example, if the bias voltage (VB) 20, applied to the bolometer, is set to 4V, the voltage output range of the D/A converter 7 is 4V±0.5V. Also, 4-bit data is to be used as input data 23 for the D/A converter 7. Referring to FIG. 2B, in case the input data 23 is '0000', it is below the lower limit of the prescribed values for the variations and hence is a low resistance defect, whereas, in case the input data 23 is '1111', it is above the upper limit of the prescribed values for the variations and hence is a high resistance defect. The output voltage 26 is to be transmitted for correcting the resistance values of the bolometer 1 by −10.8%, −9.2% , . . . , 9.2%, 10.8%, in association with the remaining 14 stages '0001', . . . , '1110'.

Figure 3:
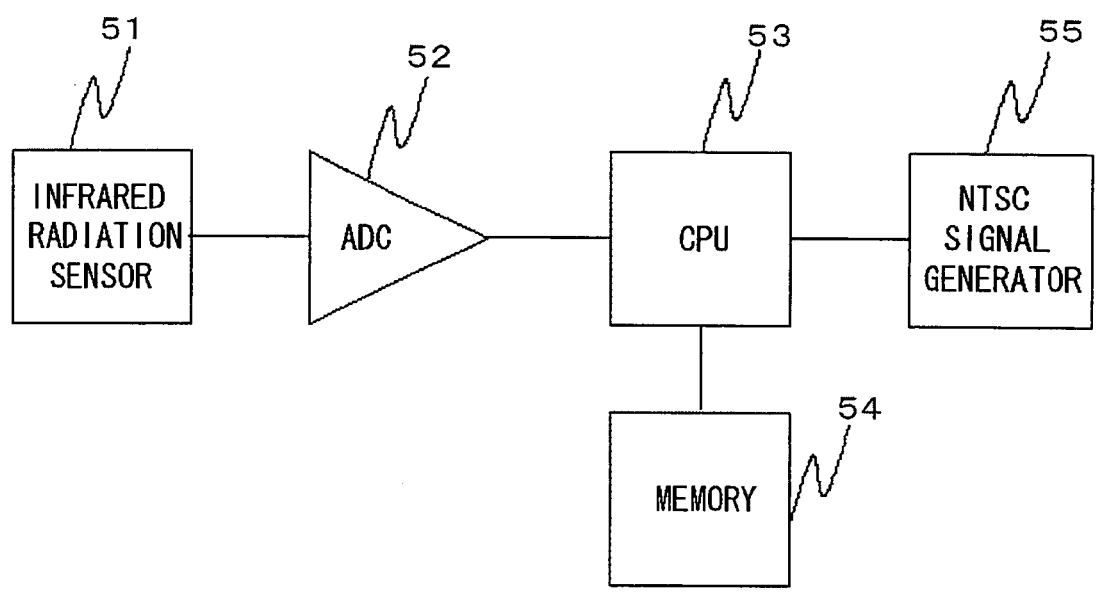
FIG. 3 is a block diagram showing the configuration of an infrared radiation image pickup apparatus.

The input data 23 for the D/A converter 7 for correcting the variations in the resistance values of the bolometers 1a, 1b are ordinarily prepared by, for example, an infrared radiation image pickup apparatus, configured as shown for example in FIG. 3, as a pre-stage of capturing an image with infrared radiations. The infrared radiation image pickup apparatus includes an infrared radiation sensor 51, an A/D converter 52, a CPU 53, a memory 54 and an NTSC signal generator 55. To an output of the infrared radiation sensor 51 is connected an A/D converter 52 for converting an analog signal into a digital signal. The CPU 53 receives a digitized output signal of the A/D converter 52 to carry out calculations on the digital signals or signal exchange with the memory 54. The CPU transmits the so generated image signal to the NTSC signal generator 55 for generating an NTSC signal.

The actual input data 23 in the infrared radiation image pickup apparatus is prepared by, for example, a binary search method. For example, if the input data 23 is represented by four bits, '1' is put up for each bit and, if the resulting value is deviated from the targeted range, the binary value is restored to '0'. If the resulting value is within the target range, the binary value '1' is kept. The decision as to whether or not the resulting value is within the target range is given by processing carried out by the CPU 53. The input data DIN 23 for all of the pixels on the bolometers of a display panel, that is, the infrared radiation image pickup elements, obtained as a result of the processing, are stored in the memory 54.

The 4-bit input data 23, thus prepared, are decoded by the decoder 8. The pixels corresponding to the most significant data 24 and the least significant data 25 of the decoder output are outside the range of the prescribed values, in the setting of FIG. 2B, and are deemed to represent failed pixels. The information on the failed pixels may also be prepared by a method different from the above data formulating method. That is, the resistance values of the bolometers may also be measured by other means than the above method, and the results measured may be stored in a memory as a database.

The input data 23, prepared by the infrared radiation image pickup apparatus, are transmitted to the decoder 8. The logical sum of the most significant data 24 and the least significant data 25 of the output of the decoder 8 is taken by the NOR circuit 9, and an output of the NOR circuit 9 is transmitted, via inverter circuit 10, as a control signal for the (second) switch 6. An output of the NOR circuit 9 is transmitted via AND circuits 19a, 19b, as control signals for the horizontal (first) switches 3a, 3b, so that, when the switch 6 is ON, the horizontal switches 3a, 3b will be OFF.

By the above-described circuit configuration, the switch 6 is turned on when the most significant data 24 or the least significant data 25 is output (that is, when at least one input to the NOR circuit is at HIGH level). On the other hand, when the most significant data 24 or the least significant data 25 is output (that is, when at least one input to the NOR circuit is at HIGH level) or the Φ HA signal is at LOW level, the horizontal switch 3a is turned off. When the most significant data 24 or the least significant data 25 is output (that is, when at least one input to the NOR circuit is at HIGH level) or the Φ HB signal is at LOW level, the horizontal switch 3b is turned off. If neither the most significant data 24 nor the least significant data 25 is output, the switch 6 is turned off. That is, in case a failed pixel at a resistance higher than the prescribed range or a failed pixel at a resistance lower than the prescribed range has been selected by sequential scanning, the bolometers 1a, 1b are isolated from the OP amplifier 5 by the horizontal switches 3a, 3b, whilst the OP amplifier 5 is in a voltage follower configuration by the switch 6. By the above configuration, it becomes possible to prevent oscillations of the OP amplifier 5 and to eliminate the voltage drop on the power supply line otherwise caused by excess bolometer current, so that it is possible to remove adverse effects on other readout circuits engaged in parallel processing.

Figure 9:
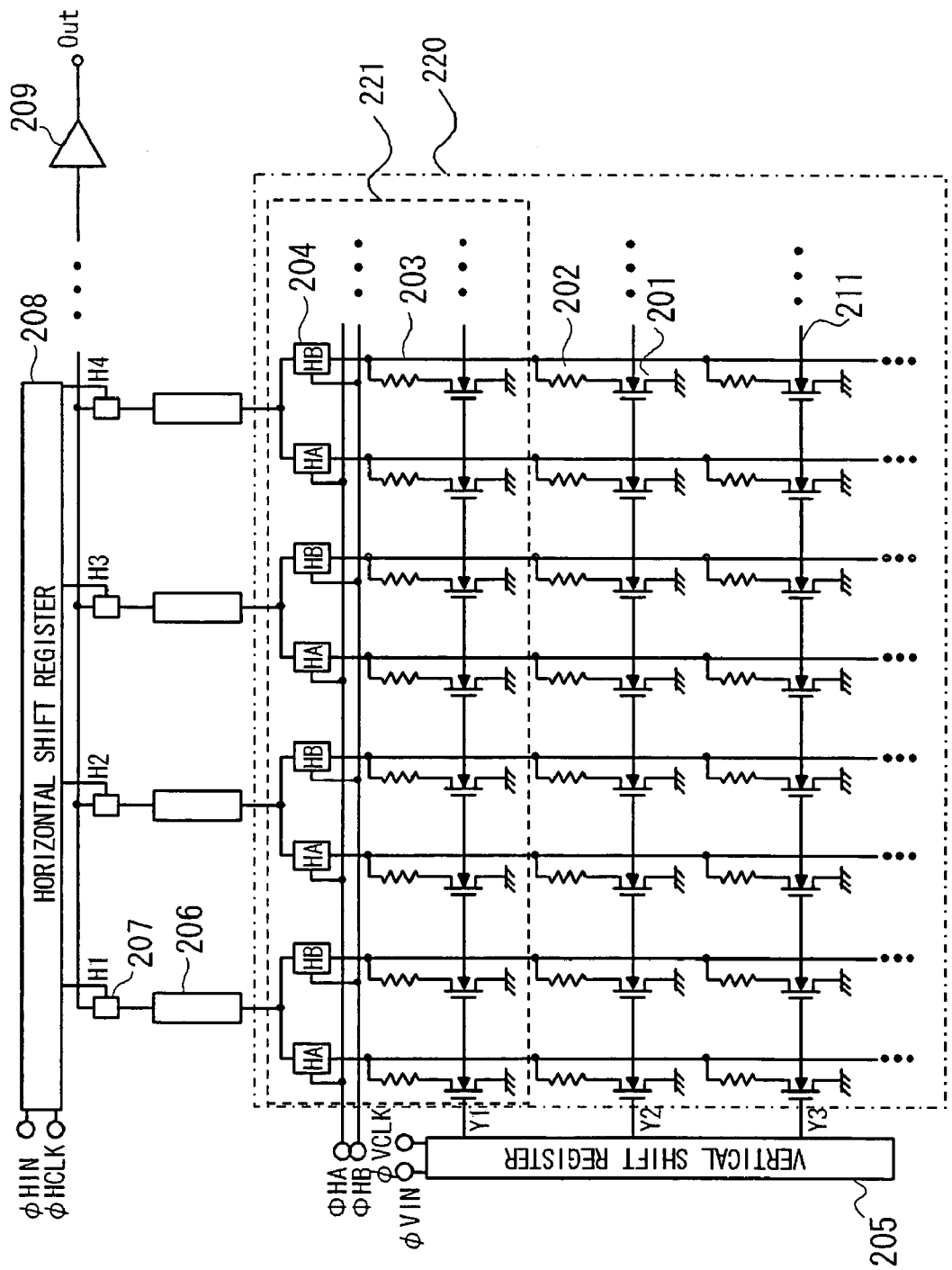
FIG. 9 is a circuit diagram showing an image pickup element, in its entirety, inclusive of the readout circuit and its peripheral part.

Meanwhile, the readout circuit, shown in FIG. 1, is used for a circuit configuration of the entire image pickup elements, shown in FIG. 9, as in the conventional system. The timing showing the integrating operation, sample hold operation and the multiplexer operation are the same as those shown in FIG. 10 explained in the foregoing.

Second Embodiment

Figure 4:
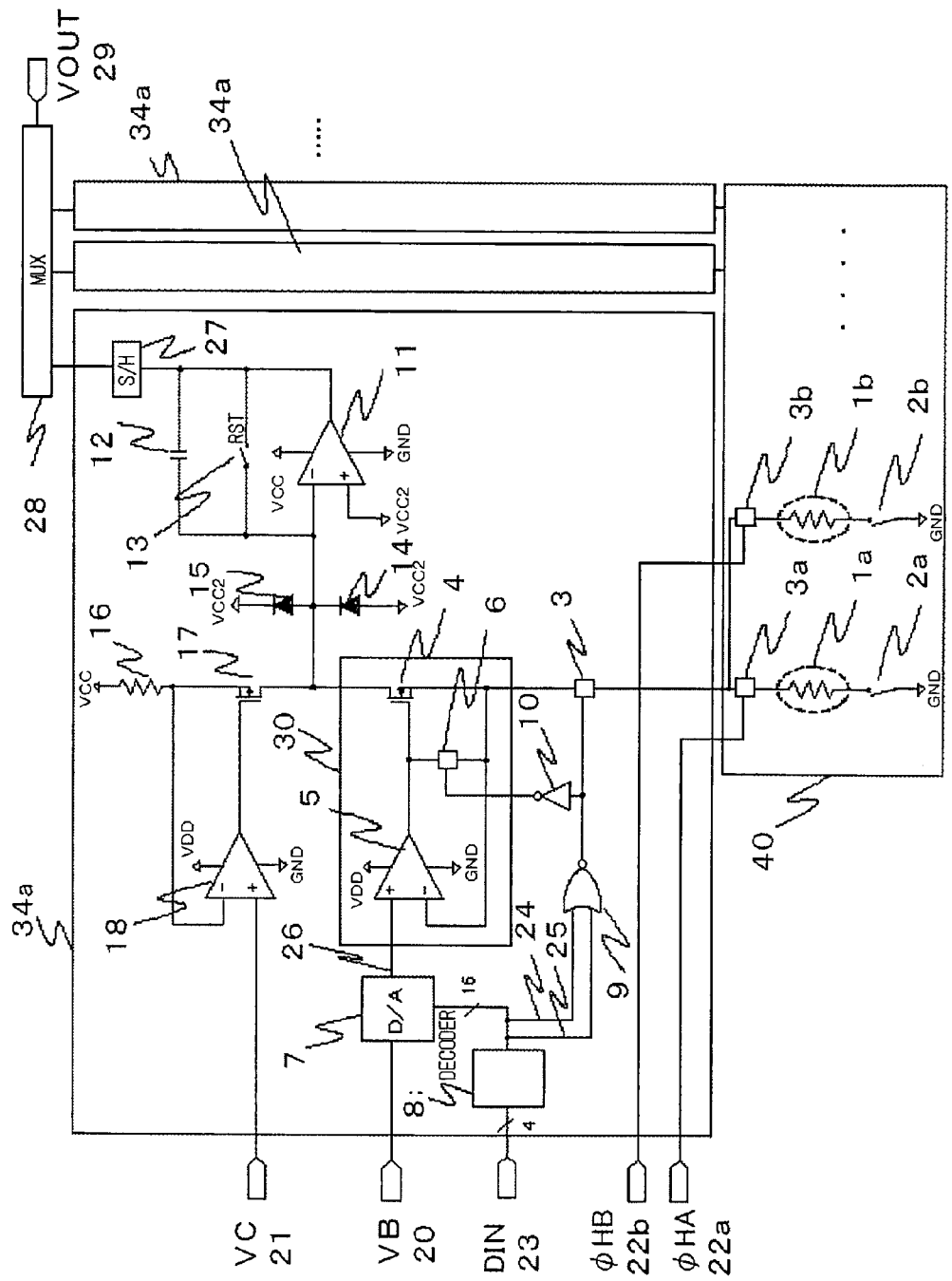
FIG. 4 is a circuit diagram showing the configuration of a semiconductor apparatus according to a second embodiment of the present invention.

FIG. 4 depicts a circuit diagram showing the configuration of a semiconductor apparatus according to a second embodiment of the present invention. In FIG. 4, the same reference symbols as those shown in FIG. 1 denote the same parts or components and the corresponding description is dispensed with. In a readout circuit 34a, the AND circuits 19a, 19b, shown in FIG. 1, are dispensed with, and the Φ HA signal 22a is directly connected to the control end of the horizontal switch 3a, while the Φ HB signal 22b is directly connected to the control end of the horizontal switch 3b. A (third) switch 3 is newly added and the output end of the NOR circuit 9 is connected to the control end of the newly added switch 3. The readout circuit 34a, thus arranged, operates similarly to the readout circuit 34.

Third Embodiment

Figure 5:
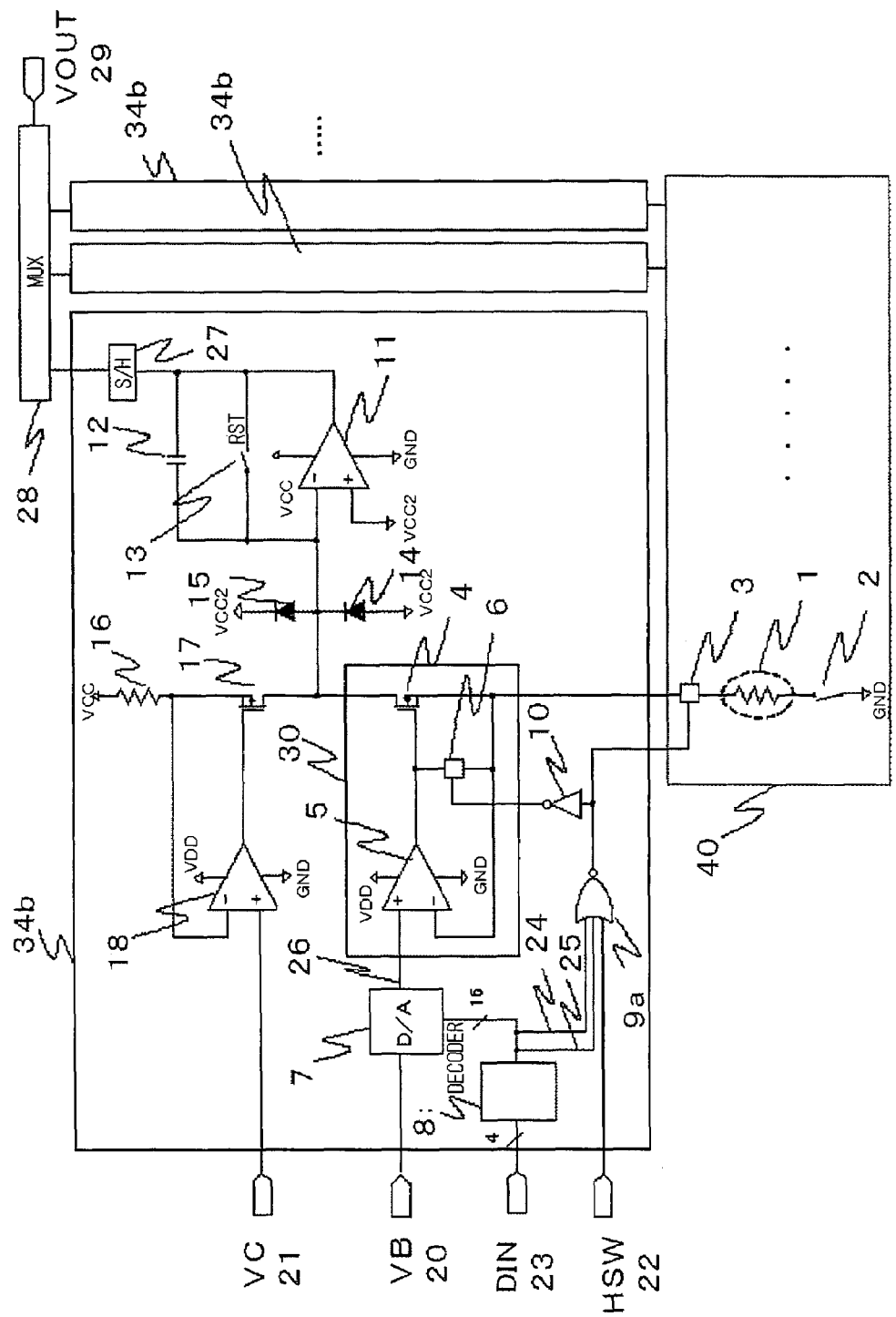
FIG. 5 is a circuit diagram showing the configuration of a semiconductor apparatus according to a third embodiment of the present invention.

FIG. 5 depicts a circuit diagram showing the configuration of a semiconductor apparatus according to a third embodiment of the present invention. In FIG. 5, the same reference symbols as those shown in FIG. 1 denote the same parts or components, and the corresponding description is dispensed with. In the semiconductor apparatus, shown in FIG. 5, a sole driving pulse signal HSW 22 for the horizontal switch during one horizontal period is used. During each horizontal period, a sole channel of the horizontal switches 3, bolometers 1 and the pixel switches 2 is controlled.

In FIG. 5, a NOR circuit 9a is of a three-input configuration, and is supplied with the most significant data 24, the least significant data 25 and the HSW signal 22, as inputs. An output of the NOR circuit 9a is transmitted to the control end of the horizontal switch 3, while being transmitted via inverter circuit 10 to the control end of the switch 6.

In this circuit configuration, when the most significant data 24 or the least significant data 25 is output (that is, when at least one of the signal lines 24, 25 is at HIGH level), or the HSW signal 22 is at HIGH level, such as during phase switching, the horizontal switch 3 is turned off, while the switch 6 is turned on. That is, as the switch 6 is turned on, the output terminal of the OP amplifier 5 is connected to its inverting input terminal (−), in a voltage follower configuration, thus providing for the gain equal to unity to assure the phase margin (allowance). When neither the most significant data 24 nor the least significant data 25 is output, while the time is not for phase switching, the horizontal switch 3 is turned on, while the switch 6 is turned off, to allow for the routine readout operation.

If, in a readout circuit 34b, described above, a failed pixel of a resistance higher than the prescribed value or a failed pixel of a resistance lower than the prescribed value has been selected by sequential scanning, the bolometer 1 is isolated by the horizontal switch 3 from the OP amplifier 5, whilst the OP amplifier 5 is connected in a voltage follower configuration by the switch 6. With this configuration, it is possible to prevent oscillations of the OP amplifier 5 and to eliminate IR drop on the power supply line by the excess bolometer current, in such a manner as to remove the adverse effect on other readout circuits engaged in parallel processing.

Fourth Embodiment

Figure 6:
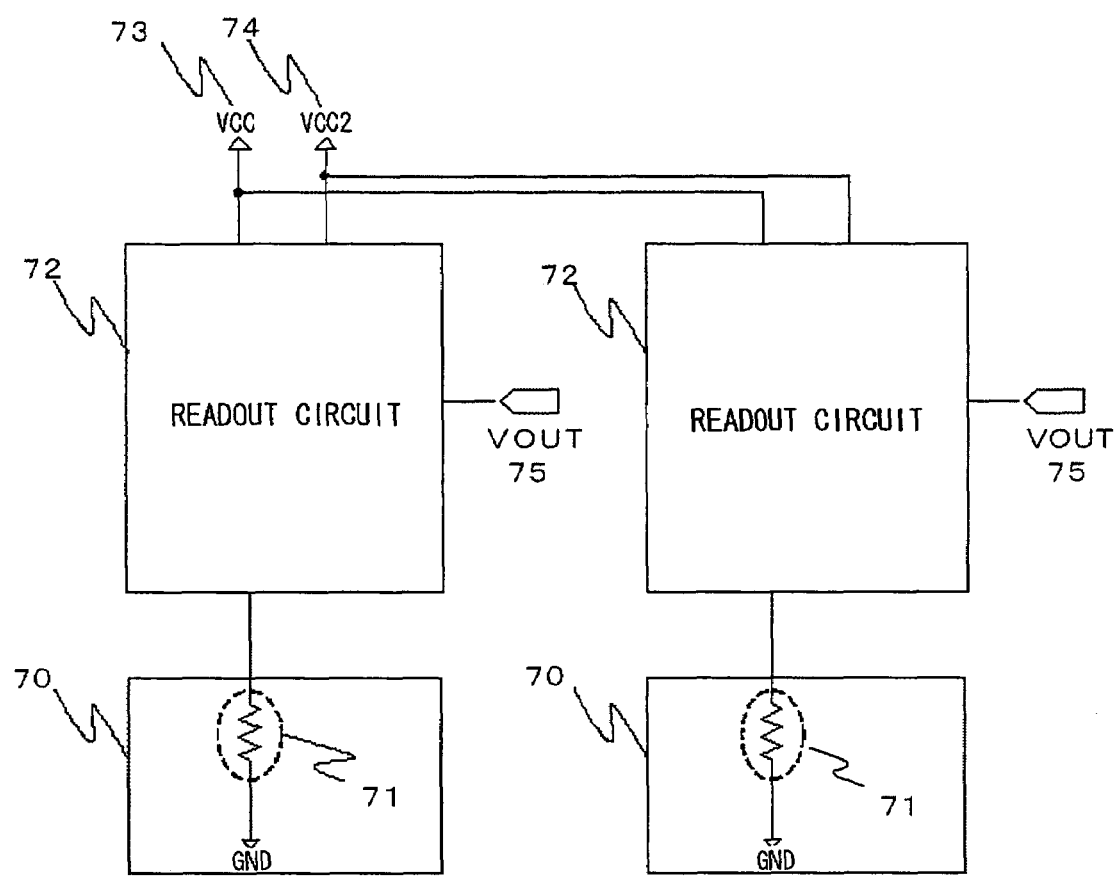
FIG. 6 is a block diagram showing the configuration of a measurement circuit according to a fourth embodiment of the present invention.

FIG. 6 depicts a block diagram showing a measurement circuit according to a fourth embodiment of the present invention. An object to be biased 70, is formed by a single-element resistor 71 adapted for transducing a physical quantity into a resistance value. The resistor 71 is e.g. a thermo-electric transducing element, such as a bolometer. To this object to be biased 70 is connected a readout circuit 72, from an output terminal 75 of which is output a sample-held output signal. There are provided a pair of sets, each made up by the object to be biased 70 and the readout circuit 72. A VCC power supply 73 and a VCC 2 power supply 74 of the readout circuits of the two sets are used common by the two readout circuits 72. Although an example of two sets is shown here, three or more sets may be used as necessary.

Figure 7:
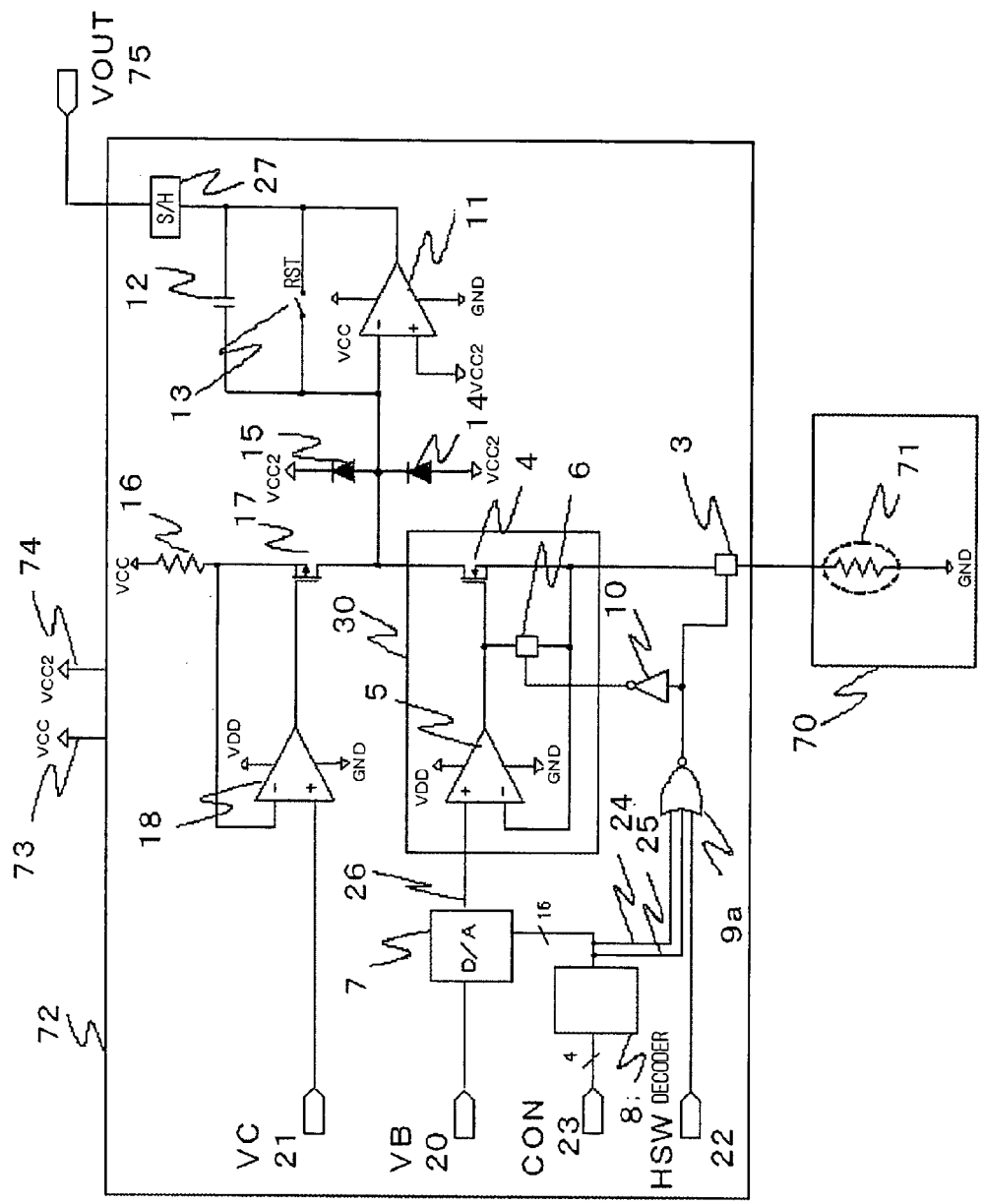
FIG. 7 is a circuit diagram showing, in detail, a single set of an object to be biased and a readout circuit, shown in FIG. 6.

FIG. 7 depicts a detailed circuit diagram showing a set of the object to be biased 70 and the readout circuit 72 shown in FIG. 6. In FIG. 7, the same reference symbols as those of FIG. 5 denote the same parts or components, and the corresponding description is dispensed with.

In FIG. 5, the resistor array 40, readout circuit 34b and the multiplexer MUX 28 are arranged as an integrated circuit. Such is not the case with FIG. 7, in which the single-element resistor 71 and the readout circuit 72 are arranged as independent blocks, while the VCC power supply 73 and the VCC 2 power supply 74 are used in common in each of the readout circuits 72. The functions and the operations of the fourth embodiment are similar to those of the third embodiment. The same may be said of the meritorious effect of the invention, that is, the effect that the variations in the power supply voltage in case of selection of the object having variations in characteristics outside the prescribed range do not affect the other readout circuit or circuits carrying out parallel processing.

The fourth embodiment may be applied not only to a semiconductor apparatus including a resistor array but also to a system including at least two each of a bias circuit, made up by an OP amplifier and a transistor, and an independent object, an output voltage of the bias circuit is applied to (an objects to be biased). There is provided means which, in case characteristics of the objects to be biased are subjected to variations, causes changes in the voltage applied from the bias circuit, in dependence upon the amount of the variations, such as to counterbalance the variations. As such means, a D/A converter, for example, is used. In setting the relationship between the input data and the output voltage, at the outset, a range of prescribed values for variations in the characteristic values of the objects to be biased is to be taken into account.

The input data is prepared by, for example, a binary search method, as explained in connection with the first embodiment, in such a manner as to counterbalance the variations in at least two objects to be biased in case these objects suffer from the variations. In case the data values prepared exceed the range of the prescribed values, as set in advance, that is, if there is an object suffering from variations exceeding the prescribed values, the bias circuit in question and the object to be biased are electrically isolated from each other. By so doing, the adverse effect of the circuit connecting to the object to be biased, the variations of which exceed the prescribed range, is not exerted on the other circuit or circuits, operating in parallel with the circuit in question, thus assuring a stabilized operation by compensation. The present invention is effective in particular in case variations in characteristics of the objects to be biased are not known from the outset, and the parallel operation is to be carried out.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor apparatus comprising:
   a plurality of resistance measurement elements, each converting a physical quantity into a resistance value;
   a first switch device connected to one of said resistance measurement elements to permit electrical current to pass through said resistance measurement element;
   a bias circuit that applies a bias voltage to one of said resistance measurement elements; and an integrating circuit that integrates a current flowing through one of said resistance measurement elements to store the integrated current;

said semiconductor apparatus detecting changes in a resistance value of one of said resistance measurement elements, based on the current stored in said integrating circuit, thereby indirectly measuring said physical quantity; wherein said bias circuit includes;

an OP amplifier, having a non-inverting input terminal connected to a bias voltage supplying terminal;

a MOS transistor, having a gate connected to an output terminal of said OP amplifier and having a source connected to an inverting input terminal of said OP amplifier and connected via said first switch device to one of said resistance measurement elements; and a second switch device connected between the gate and the source of said MOS transistor; and wherein there is provided a switch control circuit that performs control so that, when a resistance measurement element, the resistance value of which is outside a preset range, is selected, said first switch device is opened and said second switch device is short-circuited.

2. The semiconductor apparatus according to claim 1 further comprising:

a digital-to-analog converter that outputs a voltage transmitted to said bias voltage supply terminal, based on data of resistance values of said resistance measurement elements measured in advance and saved;

said switch control circuit performing control so that, when said data is preset data, said first switch device is opened and said second switch device is short-circuited.

3. The semiconductor apparatus according to claim 2 wherein said switch control circuit performs control for opening said first switch device during a period said integrating circuit is not performing an integrating operation.

4. The semiconductor apparatus according to claim 2 further comprising:

a third switch device provided in a bias current path from said bias circuit to said resistance measurement element;

said switch control circuit performing control for opening said third switch device during a period said integrating circuit is not performing an integrating operation.

5. The semiconductor apparatus according to claim 4 wherein said switch control circuit performs control for short-circuiting said second switch device during the period said integrating circuit is not performing an integrating operation.

6. The semiconductor apparatus according to claim 1 wherein said switch control circuit performs control for opening said first switch device during a period said integrating circuit is not performing an integrating operation.

7. The semiconductor apparatus according to claim 6 wherein said switch control circuit performs control for short-circuiting said second switch device during the period said integrating circuit is not performing an integrating operation.

8. The semiconductor apparatus according to claim 1 further comprising:

a third switch device provided in a bias current path from said bias circuit to said resistance measurement element;

said switch control circuit performing control for opening said third switch device during a period said integrating circuit is not performing an integrating operation.

9. The semiconductor apparatus according to claim 8 wherein said switch control circuit performs control for short-circuiting said second switch device during the period said integrating circuit is not performing an integrating operation.

10. The semiconductor apparatus according to claim 1 wherein said resistance measurement element is a thermoelectric transducing element which receives to sense infrared radiations.

11. A measurement apparatus comprising:

a plurality of objects to be biased, each converting a physical quantity into a resistance value;

a first switch device connected to one of said objects to be biased to permit electrical current to pass through said object to be biased;

a bias circuit that applies a bias voltage to one of said objects to be biased; and an integrating circuit that integrates a current flowing through one of said objects to be biased to store the integrated current;

said measurement apparatus detecting changes in a resistance value of one of said objects to be biased, based on the current stored in said integrating circuit, to indirectly measure said physical quantity; wherein said bias circuit includes;

an OP amplifier, having a non-inverting input terminal connected to a bias voltage supplying terminal;

a MOS transistor, having a gate connected to an output terminal of said OP amplifier and having a source connected to an inverting input terminal of said OP amplifier and connected via said first switch device to one of said objects to be biased; and a second switch device connected between the gate and the source of said MOS transistor; and wherein there is provided a switch control circuit that performs control so that, when the object to be biased, a resistance value of which is outside a preset range, is selected, said first switch device is opened and said second switch device is short-circuited.

12. The measurement apparatus according to claim 11 further comprising:

a digital-to-analog converter that outputs a voltage supplied to said bias voltage supply terminal, based on data of resistance value of at least one of said objects to be biased measured in advance and saved;

said switch control circuit performing control so that, when said data is preset data, said first switch device is opened and said second switch device is short-circuited.

13. The measurement apparatus according to claim 12 wherein said switch control circuit performs control for opening said first switch device during a period said integrating circuit is not performing an integrating operation.

14. The measurement apparatus according to claim 13 wherein said switch control circuit performs control for short-circuiting said second switch device during the period said integrating circuit is not performing an integrating operation.

15. The measurement apparatus according to claim 11 wherein said switch control circuit performs control for opening said first switch device during a period said integrating circuit is not performing an integrating operation.

16. The measurement apparatus according to claim 15 wherein said switch control circuit performs control for short-circuiting said second switch device during the period said integrating circuit is not performing an integrating operation.

17. The measurement apparatus according to claim 11 wherein said object to be biased is a thermo-electric transducing element which receives to sense infrared radiations.

* * * * *